United States Patent
Williams

(10) Patent No.: US 6,815,253 B2
(45) Date of Patent: Nov. 9, 2004

(54) STEREOLITHOGRAPHICALLY FABRICATED CONDUCTIVE ELEMENTS, SEMICONDUCTOR DEVICE COMPONENTS AND ASSEMBLIES INCLUDING SUCH CONDUCTIVE ELEMENTS, AND METHODS

(75) Inventor: Vernon M. Williams, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/335,027

(22) Filed: Dec. 31, 2002

(65) Prior Publication Data

US 2003/0098470 A1 May 29, 2003

Related U.S. Application Data

(60) Continuation of application No. 09/870,146, filed on May 30, 2001, now Pat. No. 6,500,746, which is a division of application No. 09/511,986, filed on Feb. 24, 2000.

(51) Int. Cl.$^7$ .......................... H01L 21/44; H01L 21/48
(52) U.S. Cl. ....................... 438/107; 438/109; 438/110; 257/723; 257/729
(58) Field of Search ............................... 438/107, 109, 438/110; 257/723, 729

(56) References Cited

U.S. PATENT DOCUMENTS

| 4,138,672 A | | 2/1979 | Kepchar |
| 4,511,595 A | * | 4/1985 | Inoue ........................ 427/581 |

(List continued on next page.)

FOREIGN PATENT DOCUMENTS

| EP | 0 493 307 A2 | 7/1992 |
| JP | 63-160351 | 7/1988 |
| JP | 2001-217614 | 8/2001 |

OTHER PUBLICATIONS

Miller, Doyle, "New Laser–Directed Deposition Technology," HDL, p. 161 (Aug. 2001).
Miller, Doyle, et al., "Maskless Mesoscale Materials Depositions," HDL, pp. 20–22 (Sep. 2001).
Webpage, Objet Prototyping the Future, "Object FullCure 700 Series", 1 page.
Webpage, Object Prototyping the Future, "How it Works", 2 pages.
U.S. patent application No. 10/641,471, filed Aug. 14, 2003, entitled "Protective Structures for Bond Wires", inventor Salman Akram.
U.S. patent application No. 10/648,163, filed Aug. 26, 2003, entitled "Method for Fabricating an Interposer", inventor Akram et al.

Primary Examiner—David Nelms
Assistant Examiner—Tu-Tu Ho
(74) Attorney, Agent, or Firm—TraskBritt

(57) ABSTRACT

Stereolithographically fabricated conductive elements and semiconductor device components and assemblies including these conductive elements. The conductive elements may have multiple superimposed, contiguous, mutually adhered layers of conductive material. In semiconductor device assemblies, the stereolithographically fabricated conductive elements may be used to electrically connect different components to one another. The conductive elements may also be used as the conductive traces and vias on circuit boards. The stereolithographically fabricated conductive elements are also useful for rerouting the bond pad locations of a semiconductor die, such as in chip-scale packages. A stereolithographic method for fabricating the conductive elements may include use of a machine vision system with at least one camera operably associated with a computer controlling a stereolithographic application of material so that the system may recognize the position, orientation, and features of a semiconductor device assembly, semiconductor die, or other substrate on which the conductive element is to be fabricated.

38 Claims, 7 Drawing Sheets

U.S. PATENT DOCUMENTS

| | | | |
|---|---|---|---|
| 4,526,807 A | * | 7/1985 | Auerbach .................... 427/55 |
| 4,578,155 A | * | 3/1986 | Halliwell et al. ............. 205/86 |
| 4,695,258 A | | 9/1987 | Hanson et al. |
| 4,891,635 A | | 1/1990 | Hata |
| 4,954,873 A | | 9/1990 | Lee et al. |
| 5,007,576 A | | 4/1991 | Congleton et al. |
| 5,059,899 A | | 10/1991 | Farnworth et al. |
| 5,079,974 A | | 1/1992 | Weiss et al. |
| 5,141,680 A | | 8/1992 | Almquist et al. |
| 5,173,220 A | | 12/1992 | Reiff et al. |
| 5,174,943 A | | 12/1992 | Hull |
| 5,264,061 A | | 11/1993 | Juskey et al. |
| 5,278,442 A | | 1/1994 | Prinz et al. |
| 5,344,298 A | | 9/1994 | Hull |
| 5,461,769 A | | 10/1995 | McGregor |
| 5,477,082 A | | 12/1995 | Buckley, III et al. |
| 5,484,314 A | | 1/1996 | Farnworth |
| 5,501,824 A | | 3/1996 | Almquist et al. |
| 5,510,066 A | | 4/1996 | Fink et al. |
| 5,541,367 A | | 7/1996 | Swamy ....................... 174/260 |
| 5,545,367 A | | 8/1996 | Bae et al. |
| 5,569,349 A | | 10/1996 | Almquist et al. |
| 5,668,405 A | | 9/1997 | Yamashita |
| 5,672,312 A | | 9/1997 | Almquist et al. |
| 5,676,904 A | | 10/1997 | Almquist et al. |
| 5,695,707 A | | 12/1997 | Almquist et al. |
| 5,705,117 A | | 1/1998 | O'Connor et al. |
| 5,776,409 A | | 7/1998 | Almquist et al. |
| 5,807,767 A | | 9/1998 | Stroupe |
| 5,855,063 A | | 1/1999 | Schreiber et al. |
| 5,855,836 A | | 1/1999 | Leyden et al. |
| 5,925,931 A | | 7/1999 | Yamamoto |
| 5,969,424 A | | 10/1999 | Matsuki et al. |
| 6,063,641 A | | 5/2000 | Seki ........................... 438/15 |
| 6,081,430 A | | 6/2000 | La Rue |
| 6,096,574 A | | 8/2000 | Smith |
| 6,159,767 A | | 12/2000 | Eichelberger |
| 6,251,488 B1 | | 6/2001 | Miller et al. |
| 6,259,962 B1 | | 7/2001 | Gothait |
| 6,268,584 B1 | | 7/2001 | Keicher et al. |
| 6,296,493 B1 | | 10/2001 | Michiya |
| 6,312,263 B1 | | 11/2001 | Higuchi et al. |
| 6,391,251 B1 | * | 5/2002 | Keicher et al. ................ 419/7 |
| 6,468,891 B2 | | 10/2002 | Williams .................... 438/597 |
| 6,524,346 B1 | | 2/2003 | Farnworth |
| 6,529,027 B1 | | 3/2003 | Akram et al. |
| 6,531,335 B1 | | 3/2003 | Grigg |
| 6,537,842 B2 | | 3/2003 | Akram |
| 6,611,053 B2 | | 8/2003 | Akram |
| 6,630,730 B2 | | 10/2003 | Grigg |
| 6,634,100 B2 | | 10/2003 | Akram et al. |
| 2002/0171177 A1 | | 11/2002 | Krischman et al. |
| 2003/0068840 A1 | | 4/2003 | Grigg |
| 2003/0102566 A1 | | 6/2003 | Franworth |
| 2003/0141885 A1 | | 7/2003 | Akram et al. |
| 2003/0151167 A1 | | 8/2003 | Kritchman et al. |
| 2003/0180974 A1 | | 9/2003 | Akram |
| 2003/0181003 A1 | | 9/2003 | Akram |
| 2003/0186496 A1 | | 10/2003 | Akram |

* cited by examiner

STEREOLITHOGRAPHICALLY FABRICATED CONDUCTIVE ELEMENTS, SEMICONDUCTOR DEVICE COMPONENTS AND ASSEMBLIES INCLUDING SUCH CONDUCTIVE ELEMENTS, AND METHODS

CROSS-REFERENCE TO RELATED APPLICATIONS

This application is a continuation of application Ser. No. 09/870,146, filed May 30, 2001, now U.S. Pat. No. 6,500, 746, issued Dec. 31, 2002, which is a divisional of application Ser. No. 09/511,986, filed Feb. 24, 2000, pending.

BACKGROUND OF THE INVENTION

1. Field of the Invention

The present invention relates to conductive elements for electrically connecting different semiconductor device components to one another. Particularly, the present invention relates to conductive elements that are carried by semiconductor devices. More particularly, the present invention relates to stereolithographically fabricated conductive elements. The present invention also relates to the conductive lines of carrier substrates, such as circuit boards, and to methods of fabricating such carrier substrates.

2. State of the Art

Intermediate Conductive Elements. An electronic device typically includes one or more semiconductor devices. The semiconductor devices of an electronic device are electrically connected to a carrier substrate, which, in turn, electrically connects each semiconductor device to other components of the electronic device. In order to fulfill the demands for electronic devices of ever-decreasing size and ever-increasing capability, much of the large, space-consuming circuitry components of conventional electronic devices have been incorporated into semiconductor devices. As a result, many state of the art electronic devices include semiconductor devices that are directly connected to one another.

Conventionally, electrical connections between a semiconductor device and a carrier substrate or another semiconductor device are made by way of wire bonds between bond pads of the semiconductor device and contact pads of the carrier substrate. Wire bonding is somewhat undesirable, however, in that the wire bonds are separately and sequentially formed. As state of the art semiconductor devices typically include large numbers of bond pads positioned closely to one another, wire bonding these semiconductor devices to carrier substrates or other semiconductor devices can be a very time-consuming process.

The semiconductor devices of many state of the art electronic devices are connected to carrier substrates or other semiconductor devices with alternative types of intermediate conductive elements. For example, semiconductor devices can be flip-chip bonded, or bonded by way of a controlled collapse chip connection (C-4) to a substrate or another semiconductor device with conductive structures, such as solder balls. When flip-chip type bonds are used, a minimal amount of the real estate on a carrier substrate or other semiconductor device component is consumed.

Tape automated bonding (TAB) processes, which employ a tape including a dielectric film with conductive traces extending thereacross, have also been used to electrically connect semiconductor devices to other semiconductor device components. Tape automated bonding is useful for forming very thin assemblies of semiconductor devices and substrates.

While all of the bond pads of a semiconductor device may be simultaneously connected with a carrier substrate or another semiconductor device when both flip-chip type bonding and TAB are used, neither of these techniques addresses the need for assemblies of both minimal lateral dimensions and minimal thickness.

Circuit Boards: Circuit boards are often assembled with semiconductor devices to electrically connect different semiconductor devices to one another or to other components of an electronic device. Typically, circuit boards have one or more layers of metal circuitry carried by the insulating, or dielectric, substrates thereof. When circuit boards have conductive circuits extending across more than one plane thereof, the circuits may be electrically connected by way of through holes that are metal plated or filled.

Typically, reinforced polymeric materials are employed as the dielectric substrates of rigid circuit boards. The most commonly used dielectric substrate material is glass-reinforced epoxy. Some circuit boards are made from polyimide resins so as to withstand higher temperatures. Other dielectric materials have also been developed and used to fabricate the dielectric substrates of circuit boards.

Some applications require that the dielectric substrate of the circuit board bend or flex during assembly of the circuit board with semiconductor or other electronic devices or while a device including the circuit board is being used. While some flexible circuit boards have substrates fabricated from flexible dielectric materials that are reinforced with woven or random fibers, unsupported polymeric films may also be used to form the substrates of flexible circuit boards.

Conventional printed circuit boards having a single-layered substrate are machined to define the edges thereof, to bevel the edges thereof, and to form through holes at desired locations. Metal conductive circuits are then formed on one or both surfaces of the printed circuit boards, in communication with metal plating or vias located in the through holes. Originally, conductive materials, such as silver, were printed onto the substrate to form the metal conductive circuits and to plate the through holes or to form vias therein.

Copper-clad laminates, which include a layer of copper secured to a dielectric substrate, can also be used to fabricate circuit boards. Copper is removed from regions of the surface of the substrate where conductive circuits are not desired. Accordingly, the process is referred to as a "subtractive" technique.

Other conventional techniques for forming metal conductive circuits and plating or filling the through holes include electroless plating, electrolytic plating, and plasma-assisted chemical vapor deposition ("CVD") processes. Etching processes may also be used to pattern the conductive circuits of printed circuit boards. As the metal circuits, plating, or vias are formed on the substrate, these processes are referred to as "additive" techniques.

The substrates of state of the art circuit boards have multiple, laminated layers. The conductive circuits of these circuit boards laterally traverse the surfaces of the boards, as well as several different planes through the interior of the substrate to accommodate the increasingly complex semiconductor devices connected to the substrate while maintaining or decreasing the size of the circuit board. In manufacturing such boards, circuit traces are fabricated, as noted above, on one layer of the substrate prior to laminating the next layer of the substrate thereto. Thus, laminated circuit boards are built up, layer by layer. The use of conventional processes to fabricate multilayer circuit boards is, however, somewhat undesirable since each new layer must be aligned with every previously formed layer of the circuit board to provide the desired functionality.

Completed circuit boards may then be tested. Optical or electrical testing may be conducted to determine whether the circuit boards will function properly.

Circuit boards are typically fabricated on a very large scale, with sheets of several circuit boards typically being supplied to semiconductor device manufacturers or electronic device manufacturers for assembly with semiconductor devices and other electronic components. Conventional, large scale circuit board fabrication processes are typically not useful for fabricating prototype circuit boards.

When a new circuit board design is needed, a prototype circuit board is usually fabricated. Due to the complexity of state of the art semiconductor devices and electronic devices, the fabrication of prototype circuit boards is a very time-consuming process. Moreover, production scale circuit boards based on a certain prototype circuit board design may not provide the same electrical performance as intended.

Accordingly, there is a need for a method that can be employed to quickly fabricate simple and multilayered circuit boards in either very small numbers or very large numbers. There is also a need for a process for fabricating multilayered circuit boards that does not require repeated alignment of each of the new layers of the circuit board with the previously fabricated layers thereof.

Stereolithography. In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate. an object, stereolithographic techniques usually involve disposition of a layer of unconsolidated or unfixed material corresponding to each layer within the object boundaries, followed by selective consolidation or fixation of the material to at least a partially consolidated, or semisolid, state in those areas of a given layer corresponding to portions of the object, the consolidated or fixed material also at that time being substantially concurrently bonded to a lower layer of the object being fabricated. The unconsolidated material employed to build an object may be supplied in particulate or liquid form, and the material itself may be consolidated or fixed, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed may be rapidly generated. Prototypes of objects might be built to verify the accuracy of the CAD file defining the object and to detect any design deficiencies and possible fabrication problems before a design is committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, preexisting object or component to create a larger product.

However, to the inventor's knowledge, stereolithography has yet to be applied to mass production of articles in volumes of thousands or millions, or employed to produce, augment or enhance products including other, preexisting components in large quantities, where minute component sizes are involved, and where extremely high resolution and a high degree of reproducibility of results are required. In particular, the inventor is not aware of the use of stereolithography to fabricate intermediate conductive elements between semiconductor device components or on circuit boards. Furthermore, conventional stereolithography apparatus and methods fail to address the difficulties of precisely locating and orienting a number of preexisting components for stereolithographic application of material thereto without the use of mechanical alignment techniques or to otherwise assuring precise, repeatable placement of components.

BRIEF SUMMARY OF THE INVENTION

The present invention includes stereolithographically fabricated intermediate conductive elements. Accordingly, the intermediate conductive elements of the present invention may have one or more layers of conductive material. In multilayer embodiments, the intermediate conductive elements have a plurality of superimposed, contiguous, mutually adhered layers of conductive material. Any known conductive material may be used to form the intermediate conductive elements of the present invention. Exemplary conductive materials include, without limitation, electrically conductive thermoplastic elastomers and metals.

The invention also includes semiconductor device assemblies with one or more semiconductor devices that are electrically connected to one or more other semiconductor device components, such as carrier substrates, leads, or other semiconductor devices, by way of the intermediate conductive elements of the present invention. These intermediate conductive elements are substantially carried upon the semiconductor device and the component to which the semiconductor device is connected. For example, when used to connect one semiconductor die to another semiconductor die, an intermediate conductive element of the present invention contacts a bond pad of the first semiconductor die, extends across a portion of the active surface of the first semiconductor die towards the second semiconductor die, extends over the active surface of the second semiconductor die, and contacts a corresponding bond pad of the second semiconductor die. As another example, when the intermediate conductive elements of the present invention are used to connect a semiconductor die to a carrier substrate, one end of an intermediate conductive element may contact a contact (e.g., a bond pad) of the semiconductor die, extend over an active surface of the semiconductor die, down a peripheral edge thereof, and over a surface of the carrier substrate, and contact a contact pad of the carrier substrate at a second end of the intermediate conductive element.

In another aspect, the present invention includes a printed circuit board with a substrate that carries one or more stereolithographically fabricated conductive traces. Each conductive trace may have one or more layers of conductive material. The conductive material may be, for example, a thermoplastic conductive elastomer or a metal.

According to another aspect of the present invention, the substrate of the printed circuit board has two or more superimposed, contiguous, mutually adhered layers of dielectric material. One or more of these layers of the substrate may be fabricated using stereolithography techniques. For example, each stereolithographically formed layer of the substrate may be defined by, first, forming a layer of unconsolidated (i.e., uncured or particulate) dielectric material, then consolidating (i.e., curing or bonding particles) of the dielectric material in selected regions of the layer. Alternatively, each of the layers of the substrate may be fabricated by spraying dielectric material so as to define the desired configuration of the layer, permitting the dielectric material to at least partially harden or solidify, then using the same technique to form and stack one or more additional layers of dielectric material to complete the substrate.

When both the intermediate conductive elements and the substrate are fabricated by stereolithographic techniques, layers of the intermediate conductive elements and of the substrate residing in the same planes can be fabricated substantially simultaneously or sequentially.

The materials of both the intermediate conductive elements and the substrate may be either rigid or flexible. Accordingly, the methods of the present invention can be used to fabricate both rigid and flexible circuit boards.

The stereolithography, or "layered manufacturing," processes that are used to fabricate the intermediate conductive elements or circuit board substrates of the present invention are initiated and controlled by a 3-D CAD-programmed computer.

When stereolithography is used to fabricate intermediate conductive elements between assembled semiconductor device components, the stereolithographic method of fabricating the intermediate conductive elements of the present invention preferably includes the use of a machine vision system to locate the assembled semiconductor device components on which intermediate conductive elements are to be fabricated, as well as the various features of the semiconductor device components. The use of a machine vision system directs the alignment of a stereolithography system with each substrate or layer for material disposition purposes. Accordingly, the assembled semiconductor device components need not be precisely mechanically aligned with any component of the stereolithography system to practice the stereolithographic embodiment of the method of the present invention.

As noted previously herein, in a preferred embodiment, the intermediate conductive elements of the present invention are preferably fabricated using three-dimensional printing techniques, wherein a conductive material having the desired properties and that is solid at ambient temperatures is heated to liquify same. Exemplary materials that are useful for forming intermediate conductive elements according to the present invention include thermoplastic conductive elastomers and metals. The liquified conductive material is then disposed, in a precisely focused spray (e.g., through an ink jet type nozzle) under control of a computer and, preferably, responsive to input from a machine vision system, such as a pattern recognition system, to form a layer of each of the intermediate conductive elements. The conductive material is then permitted to at least partially harden.

A circuit board substrate may be similarly manufactured, except with a dielectric material rather than a conductive material. Alternatively, other stereolithographic processes may be employed to fabricate the substrate. For example, the substrate may be fabricated using precisely focused electromagnetic radiation in the form of an ultraviolet (UV) wavelength laser to fix or cure selected regions of a layer of a liquid photopolymer material disposed on the semiconductor device or other substrate.

Other features and advantages of the present invention will become apparent to those of skill in the art through consideration of the ensuing description, the accompanying drawings, and the appended claims.

DETAILED DESCRIPTION OF THE INVENTION

Stereolithography Apparatus and Methods

Figure 11:
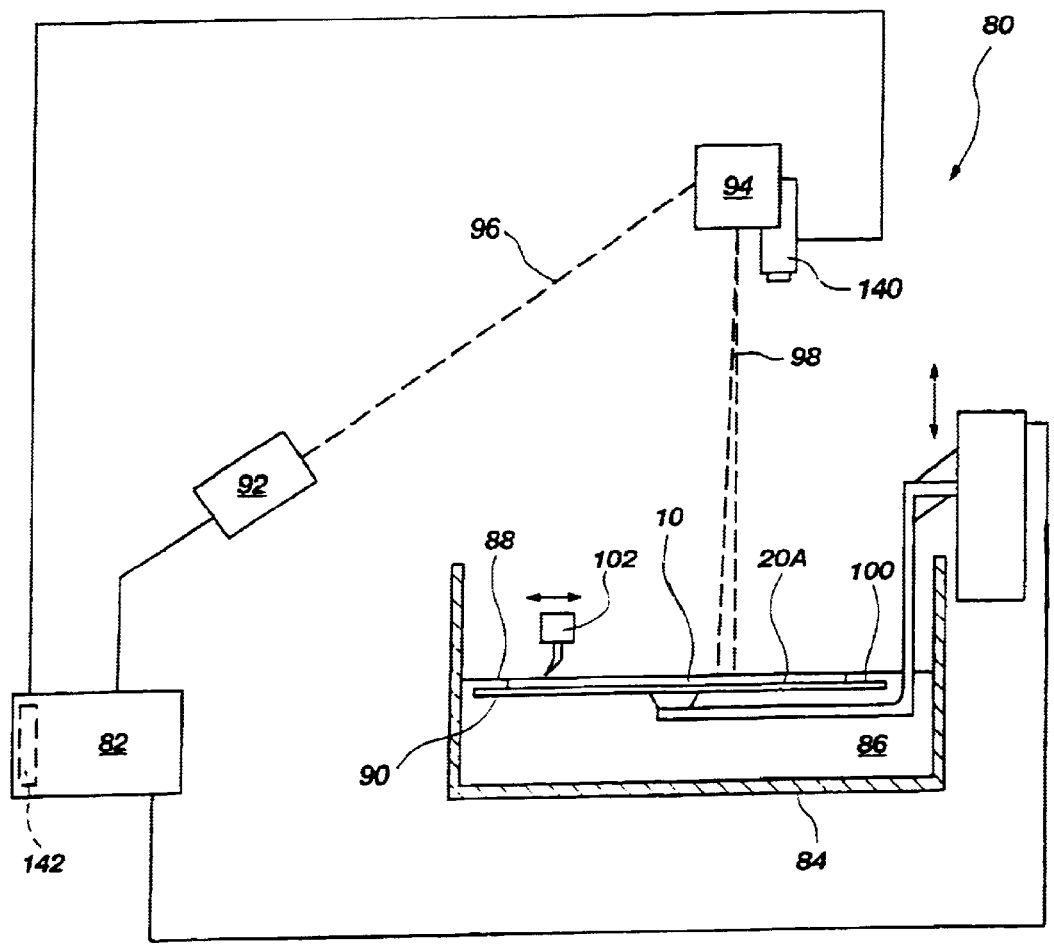
FIG. 11 is a schematic representation of a first apparatus for stereolithographically fabricating structures in accordance with a first embodiment of the method of the present invention.

FIG. 11 schematically depicts various components, and operation, of exemplary stereolithography apparatus 80 to facilitate the reader's understanding of the technology employed in implementation of the methods of the present invention, although those of ordinary skill in the art will understand and appreciate that apparatus of other designs and manufacture may be employed in practicing the method of the present invention. Apparatus 80 and the operation thereof are described in great detail in United States patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,345,391; 5,358,673; 5,447,822; 5,481,470; 5,495,328; 5,554,336; 5,556,590; 5,569,431; 5,571,471; 5,573,722; 5,609,812; 5,609,813; 5,610,824; 5,630,981; 5,637,169; 5,651,934; 5,667,820; 5,676,904; 5,688,464; 5,693,144; 5,711,911; 5,779,967; 5,814,265; 5,850,239; 5,854,748; 5,855,718; 5,885,511; 5,897,825; 5,902,537; 5,902,538; 5,904,889; 5,943,235; and 5,945,058. The disclosure of each of the foregoing patents is hereby incorporated herein by this reference.

With continued reference to FIG. 11 and as noted above, a 3-D CAD drawing of an object to be fabricated in the form of a data file is placed in the memory of a computer 82 controlling the operation of apparatus 80 if computer 82 is not a CAD computer in which the original object design is effected. In other words, an object design may be effected in a first computer in an engineering or research facility and the data files transferred via wide or local area network, tape, disc, CD-ROM, or as otherwise known in the art to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Apparatus 80 also includes a reservoir 84 (which may comprise a removable reservoir interchangeable with others containing different materials) of an unconsolidated material 86 to be employed in fabricating the intended object. Unconsolidated material 86 useful in apparatus 80 is a liquid, photo-curable polymer, or "photopolymer" that cures in response to light in the UV wavelength range. The surface level 88 of material 86 is automatically maintained at an extremely precise, constant magnitude by devices known in the art responsive to output of sensors within apparatus 80 and preferably under control of computer 82. A support platform or elevator 90, precisely vertically movable in fine, repeatable increments responsive to control of computer 82, is located for movement downward into and upward out of material 86 in reservoir 84.

Figure 13:
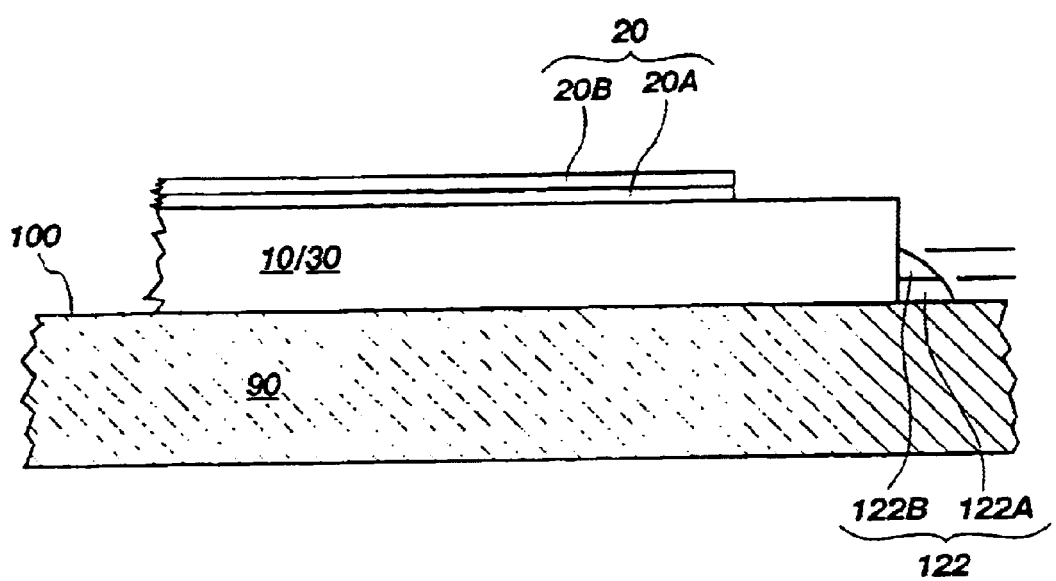
FIG. 13 is partial cross-sectional schematic representation of a semiconductor device disposed on a platform of a stereolithographic apparatus for the formation of intermediate conductive elements between contacts of the assembled semiconductor device components.

An object may be fabricated directly on platform 90, or on a substrate disposed on platform 90. When the object is to be fabricated on a substrate disposed on platform 90, the substrate may be positioned on platform 90 and secured thereto by way of one or more base supports 122 (FIG. 13). Such base supports 122 may be fabricated before or simultaneously with the stereolithographic fabrication of one or more objects on platform 90 or a substrate disposed thereon. These base supports 122 may support, or prevent lateral movement of, the substrate relative to a surface 100 of platform 90. Base supports 122 may also provide a perfectly horizontal reference plane for fabrication of one or more objects thereon, as well as facilitate the removal of a substrate from platform 90 following the stereolithographic fabrication of one or more objects on the substrate. Moreover, where a so-called "recoater" blade 102 is employed to form a layer of material on platform 90 or a substrate disposed thereon, base supports 122 can preclude inadvertent contact of recoater blade 102, to be described in greater detail below, with surface 100 of platform 90.

Apparatus 80 has a UV wavelength range laser plus associated optics and galvanometers (collectively identified as laser 92) for controlling the scan of laser beam 96 in the X-Y plane across platform 90. Laser 92 has associated therewith a mirror 94 to reflect laser beam 96 downwardly as laser beam 98 toward surface 100 of platform 90. Laser beam 98 is traversed in a selected pattern in the X-Y plane, that is to say in a plane parallel to surface 100, by initiation of the galvanometers under control of computer 82 to at least partially cure, by impingement thereon, selected portions of material 86 disposed over surface 100 to at least a partially consolidated (e.g., semisolid) state. The use of mirror 94 lengthens the path of the laser beam, effectively doubling same, and provides a more vertical laser beam 98 than would be possible if the laser 92 itself were mounted directly above platform surface 100, thus enhancing resolution.

Referring now to FIGS. 11 and 13, data from the STL files resident in computer 82 is manipulated to build an object, such as an intermediate conductive element 20, 20', 20", or 20''', illustrated in FIGS. 1–10, or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, base supports 122 may be programmed as a separate STL file from the other objects to be fabricated. The primary STL file for the object or objects to be fabricated and the STL file for base support(s) 122 are merged.

Before fabrication of a first layer for a support 122 or an object to be fabricated is commenced, the operational parameters for apparatus 80 are set to adjust the size (diameter if circular) of the laser light beam used to cure material 86. In addition, computer 82 automatically checks and, if necessary, adjusts by means known in the art the surface level 88 of material 86 in reservoir 84 to maintain same at an appropriate focal length for laser beam 98. U.S. Pat. No. 5,174,931, referenced above and previously incorporated herein by reference, discloses one suitable level control system. Alternatively, the height of mirror 94 may be adjusted responsive to a detected surface level 88 to cause the focal point of laser beam 98 to be located precisely at the surface of material 86 if the surface level 88 is permitted to vary, although this approach is more complex. Platform 90 may then be submerged in material 86 in reservoir 84 to a depth equal to the thickness of one layer or slice of the object to be formed, and the liquid surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122 A of base support 122 and filling in solid portions thereof. Platform 90 is then lowered by a distance equal to the thickness of second layer 122B, and laser beam 98 scanned over selected regions of the surface of material 86 to define and fill in the second layer while simultaneously bonding the second layer to the first. The process may be repeated as often as necessary, layer by layer, until base support 122 is completed. Platform 90 is then moved relative to mirror 94 to form any additional base supports 122 on platform 90 or a substrate disposed thereon or to fabricate objects upon platform 90, base support 122, or a substrate, as provided in the control software. The number of layers required to erect support 122 or one or more other objects to be formed depends upon the height of the object or objects to be formed and the desired layer thicknesses of layers 20A, 20B, etc. The layers of a stereolithographically fabricated structure may have different thicknesses.

If a recoater blade 102 is employed, the process sequence is somewhat different. In this instance, surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on platform 90 or a substrate thereon is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and surface level 88 are coplanar and the surface of the unconsolidated material 86 is still. Laser 92 is then initiated to scan with laser beam 98 and define the first layer 20A. The process is repeated, layer by layer, to define each succeeding layer and simultaneously bond same to the next lower layer until all of the layers of the object or objects to be fabricated are completed. A more detailed discussion of this sequence and apparatus for performing same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material 86 over surface 100, over a substrate disposed thereon, or over the highest completed layer of the object or objects being formed, then raising platform 90 and horizontally traversing a so-called "meniscus" blade horizontally over platform 90 to form a layer of unconsolidated material having the desired thickness over platform 90, the substrate, or each of the objects being formed. Laser 92 is then initiated and a laser beam 98 scanned over the layer of unconsolidated material to define at least the boundaries of the solid regions of the next higher layer of the object or objects being fabricated.

Yet another alternative to layer preparation of unconsolidated (e.g., liquid) material 86 is to merely lower platform 90 to a depth equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to practice of the present invention, so no further details relating thereto will be provided herein.

In practicing the present invention, a commercially available stereolithography apparatus operating generally in the manner as that described above with respect to apparatus 80 of FIG. 11 may be employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc., of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Inc.

By way of example and not limitation, the layer thickness of material 86 to be formed, for purposes of the invention, may be on the order of about 0.0001 to 0.0300 inch, with a high degree of uniformity. It should be noted that different material layers may have different heights, so as to form a structure of a precise, intended total height or to provide different material thicknesses for different portions of the structure. The size of the laser beam "spot" impinging on the surface of material 86 to cure same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the "field of exposure," such area being substantially coextensive with the vision field of a machine vision system employed in the apparatus of the invention as explained in more detail below. The longer and more effectively vertical the path of laser beam 96/98, the greater the achievable resolution.

Figure 12:
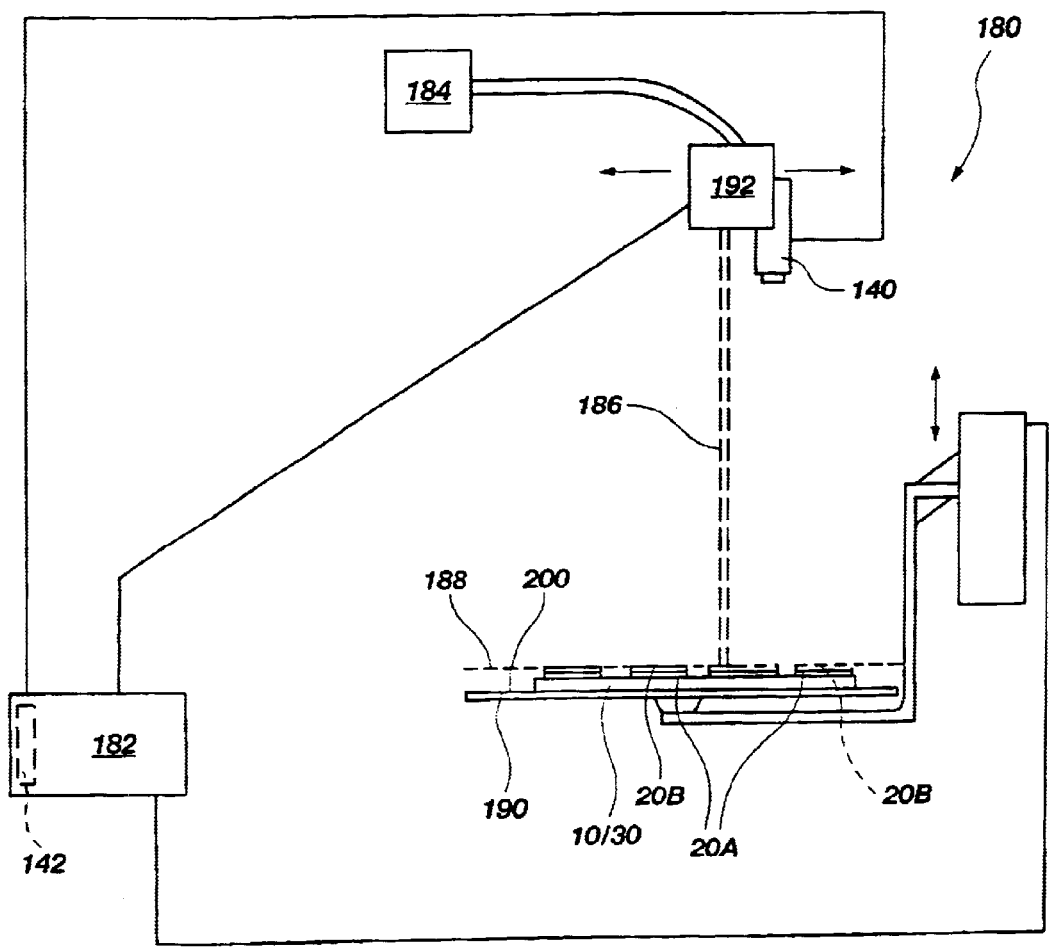
FIG. 12 is a schematic representation of a second apparatus for stereolithographically fabricating structures in accordance with a second embodiment of the method of the present invention.

Another apparatus 180 useful in implementing the methods of the present invention, referred to as a thermal stereolithography apparatus, is schematically illustrated in FIG. 12. Apparatus 180 and the operation of apparatus 180 are described in great detail in United States patents assigned to 3D Systems, Inc. of Valencia, Calif., such patents including, without limitation, U.S. Pat. Nos. 5,141,680; 5,344,298; 5,501,824; 5,569,349; 5,672,312; 5,695,707; 5,776,409; 5,855,836. The disclosure of each of the foregoing patents is hereby incorporated herein by this reference.

As noted above, a 3-D CAD drawing of an object to be fabricated in the form of a data file may be placed in the memory of a computer 182 controlling the operation of apparatus 180 if computer 182 is not a CAD computer in which the original object design is effected. Preferably, the data is formatted in an STL file.

Apparatus 180 includes a support platform or elevator 190, precisely vertically movable in fine, repeatable increments responsive to control of computer 182. An object may be fabricated directly on platform 190, or on a substrate disposed on platform 190. When the object is to be fabricated on a substrate disposed on platform 190, the substrate may be positioned on platform 190 and secured thereto by way of one or more base supports (see FIG. 13). Such base supports 122 may be fabricated before or simultaneously with the stereolithographic fabrication of one or more objects on platform 190 or a substrate disposed thereon. These base supports 122 may support, or prevent lateral movement of, the substrate relative to a surface 200 of platform 190. Base supports 122 may also provide a perfectly horizontal reference plane for fabrication of one or more objects thereon, as well as facilitate the removal of a substrate from platform 190 following the stereolithographic fabrication of one or more objects on the substrate.

Apparatus 180 also includes a reservoir 184 (which may comprise a removable reservoir interchangeable with others containing different materials) of an unconsolidated material 186 to be employed in fabricating the intended object. Unconsolidated material 186 useful with apparatus 180 is a heated, flowable material that is typically solid at the operating temperatures of a semiconductor device.

One or more spray heads 192 of apparatus 180 communicate with and receive unconsolidated material 186 from reservoir 184. Each spray head 192, under control of computer 182, effects the deposition of unconsolidated material 186 in the X-Y plane of platform 190, on a substrate disposed on platform 190, or on an object being formed.

Data from the STL files resident in computer 182 is manipulated to build an object, such as intermediate conductive element 20, illustrated in FIGS. 1–10, or base supports 122, illustrated in FIG. 13, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.003 to about 0.030 inch thick. As mentioned previously, a thinner slice promotes higher resolution by enabling better reproduction of fine vertical surface features of the object or objects to be fabricated.

When one or more base supports 122 are to be stereolithographically fabricated, base supports 122 may be programmed as an STL file separate from the STL files for other objects to be fabricated. The primary STL file for the object or objects to be fabricated and the STL file for base support(s) 122 are merged.

Before fabrication of a first layer for a support 122 or an object to be fabricated is commenced, the operational parameters for apparatus 180 are set to adjust the size (diameter if circular) of the stream of unconsolidated material 186 to be ejected from each spray head 192. In addition, computer 182 automatically checks and, if necessary, adjusts by means known in the art the surface level 188 of platform 190 to maintain same at an appropriate length from spray heads 192 to obtain an object having the desired resolution. U.S. Pat. No. 5,174,931, referenced above and previously incorporated herein by reference, discloses one suitable level control system.

Each spray head 192 is then activated so as to deposit unconsolidated material 186 over surface 200 of platform 190 to form at least the boundaries of a first layer 122A of base support 122 (FIG. 13) and to fill in solid portions thereof. The deposited material 186 is then permitted to at least partially harden, or consolidate, prior to forming another layer thereon. Each layer of the object being fabricated may be laterally supported by a material that remains substantially unconsolidated at ambient temperatures and that, preferably, will not adhere to the just-formed layer of material 186.

After a layer is formed, platform 190 maybe lowered a distance substantially equal to the thickness of the just-formed layer so as to maintain a substantially constant distance between spray heads 192 and the surface on which the next layer of unconsolidated material 186 is to be disposed. Spray heads 192 may then be scanned over selected regions of surface 200 or the surface of the previously formed layer to define and fill in the second layer while simultaneously bonding the second layer to the first. The process may be then repeated, as often as necessary, layer by layer, until base support 122 is completed. The number of layers required to erect support 122 or one or more other objects to be formed depends upon the height of the object or objects to be formed and the desired thicknesses of layers 20A, 20B, etc. The layers of a stereolithographically fabricated structure may have different thicknesses.

Exemplary commercially available thermal stereolithography apparatus operating generally in the manner as that described above with respect to apparatus 180 of FIG. 12 include, but are not limited to, the THERMOJET™ printer offered by 3D Systems, Inc., of Valencia, Calif. Of course, as with apparatus 80 depicted in FIG. 11, apparatus 180 may be employed with further additions and modifications as hereinafter described. Thermoplastic materials, or "thermopolymers," believed to be suitable for use in practicing the method of the present invention in combination with apparatus 180 include ThermoJet 88 Thermopolymer, available from 3D Systems, Inc., as well as other nonconductive and electrically conductive thermopolymers known in the art.

By way of example and not limitation, the layer thickness of material 186 to be formed, for purposes of the invention, may be on the order of about 0.003 to 0.030 inch, with a high degree of uniformity. It should be noted that different material layers may have different heights, so as to form a structure of a precise, intended total height or to provide different material thicknesses for different portions of the structure. Resolution is preferably about 300 dpi (dots per inch) or about 0.003 inch in the X-Y plane (parallel to surface 200). Of course, it is desirable to have substantially this high a resolution across the entire surface 200 of platform 190 to be scanned by spray heads 192, such area being termed the "field of exposure," such area being substantially coextensive with the vision field of a machine vision system employed in the apparatus of the invention as explained in more detail below. Of course, since apparatus 180 deposits material by way of one or more spray heads 192, the resolution with which an object can be formed by apparatus 180 is dependent, at least in part, upon spray heads 192 and the type of material 186 deposited thereby.

Referring now to both FIGS. 11 and 12, it should be noted that apparatus 80, 180 useful in the methods of the present invention include cameras 140 which are in communication with computers 82, 182, respectively, and are preferably located, as shown, in close proximity to optics and mirror 94 located above surface 100, 200 of support platform 90, 190. Each camera 140 may be any one of a number of commercially available cameras, such as capacitive-coupled discharge (CCD) cameras available from a number of vendors. Suitable circuitry as required for adapting the output of camera 140 for use by computer 82, 182 may be incorporated in a board 142 installed in computer 82, 182 which is programmed as known in the art to respond to images generated by camera 140 and processed by board 142. Camera 140 and board 142 may together comprise a so-called "machine vision system" and, specifically, a "pattern recognition system" (PRS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Stereolithographic Fabrication of the Conductive Elements

In order to facilitate fabrication of one or more intermediate conductive elements 20 in accordance with the method of the present invention with apparatus 80, 180, a data file representative of the size, configuration, thickness and surface topography of, for example, a particular type and design of semiconductor device 10 or other substrate upon which one or more intermediate conductive elements 20 are to be fabricated is placed in the memory of computer 82, 182.

One or more semiconductor devices 10, carrier substrates 30, or other semiconductor device components may be placed on surface 100, 200 of platform 90, 190 for fabrication of intermediate conductive elements 20 in communication with contact pads thereof (e.g., contact pads 12 of semiconductor device 10) (shown in FIGS. 1–4). One or more semiconductor devices 10, carrier substrates 30, or other semiconductor device components may be held on or supported above platform 90, 190 by stereolithographically formed base supports 122. When apparatus 80 is used, these base supports 122 are formed by sequentially disposing one or more layers of material 86 on surface 100 and selectively altering material 86 by use of laser 92. Apparatus 180 forms base supports 122 by selectively depositing one or more layers of material 186 from spray heads 192.

Camera 140 is then activated to locate the position and orientation of each semiconductor device 10, carrier substrate 30, or other type of semiconductor device component upon which intermediate conductive elements 20 are to be fabricated. The features of each semiconductor device 10, carrier substrate 30, or other type of semiconductor device component are compared with those in the data file residing in memory, the locational and orientational data for each semiconductor device 10, carrier substrate 30, or other type of semiconductor device component then also being stored in memory. It should be noted that the data file representing the design size, shape and topography for each semiconductor device 10, carrier substrate 30, or other type of semiconductor device component may be used at this juncture to detect physically defective or damaged semiconductor devices 10, carrier substrates 30, or other types of semiconductor device components prior to fabricating intermediate conductive elements 20 thereon or before conducting further packaging of semiconductor devices 10, carrier substrates 30, or other types of semiconductor device components. Accordingly, such damaged or defective semiconductor devices 10, carrier substrates 30, or other types of semiconductor device components can be deleted from the process of fabricating intermediate conductive elements 20 and from further packaging. It should also be noted that data files for more than one type (size, thickness, configuration, surface topography) of each semiconductor device 10, carrier substrate 30, or other type of semiconductor device component may be placed in computer memory and computer 82, 182 programmed to recognize not only the locations and orientations of each semiconductor device 10, carrier substrate 30, or other type of semiconductor device component, but also the type of semiconductor component at each location upon platform 90, 190 so that material 86 may be at least partially consolidated by laser beam 98 or material 186 selectively deposited by spray heads 192 in the correct pattern and to the height required to define intermediate conductive elements 20 in the appropriate, desired locations on each semiconductor device 10, carrier substrate 30, or other semiconductor device component.

Fabrication of the Conductive Elements by Photo-Stereolithography

When apparatus 80 is used, as depicted in FIGS. 11 and 13, the one or more semiconductor devices 10, carrier substrates 30, or other semiconductor device components on platform 90 may then be submerged partially below the surface level 88 of unconsolidated (e.g., liquid) material 86 to a depth greater than the thickness of a first layer of material 86 to be at least partially consolidated (e.g., cured to at least a semisolid state) to form the lowest layer of each intermediate conductive element 20 at the appropriate location or locations on each semiconductor device 10, carrier substrate 30, or other type of semiconductor device component, then raised to a depth equal to the layer thickness, the surface level 88 of material 86 being allowed to become calm. Photopolymers that are useful as material 86 exhibit a desirable dielectric constant and low shrinkage upon cure, are of sufficient (i.e., semiconductor grade) purity, exhibit good adherence to other semiconductor device materials, and have a coefficient of thermal expansion (CTE) similar to that of the materials adjacent thereto. Preferably, the CTE of material 86 is sufficiently similar to that of the adjacent materials to prevent undue stressing thereof during thermal cycling of semiconductor device 10, carrier substrate 30, or other semiconductor device component in testing, subsequent processing, and subsequent normal operation. Exemplary photopolymers exhibiting these properties are believed to include, but are not limited to, the above-referenced resins from Ciba Specialty Chemicals Inc. One area of particular concern in determining resin suitability is the substantial absence of mobile ions and, specifically, fluorides.

Laser 92 is then activated and scanned to direct laser beam 98, under control of computer 82, toward specific locations of surface level 88 relative to each semiconductor device 10, carrier substrate 30, or other type of semiconductor device component to effect the aforementioned partial cure of material 86 to form a first layer 20A of each intermediate conductive element 20. Platform 90 is then lowered into reservoir 84 and raised a distance equal to the desired thickness of another layer 20B of each intermediate conductive element 20, and laser 92 is activated to add another layer 20B to each intermediate conductive element 20 under construction. This sequence continues, layer by layer, until each of the layers of intermediate conductive elements 20 has been completed.

In FIG. 13, the first layer of intermediate conductive element 20 is identified by numeral 20A, and the second layer is identified by numeral 20B. Likewise, the first layer of base support 122 is identified by numeral 122A and the second layer thereof is identified by numeral 122B. As illustrated, base support 122 and intermediate conductive element 20 have only two layers. Intermediate conductive elements 20 with any number of layers are, however, within the scope of the present invention.

In addition to being useful for fabricating intermediate conductive elements 20, apparatus 80 may also be used to fabricate nonconductive structures, such as dielectric layers and substrate layers, such as the nonconductive support layers of a circuit board or other carrier substrate.

When apparatus 80 is employed to fabricate one or more intermediate conductive elements 20 or other structures (e.g., one or more layers of a carrier substrate 30), each layer 20A, 20B of each intermediate conductive element 20 is preferably built by first defining any internal and external object boundaries of that layer with laser beam 98, then hatching solid areas of intermediate conductive elements 20 located within the object boundaries with laser beam 98. An internal boundary of a layer may comprise an aperture, a through hole, a void, or a recess in carrier substrate 30, for example. If a particular layer includes a boundary of a void in the object above or below that layer, then laser beam 98 is scanned in a series of closely spaced, parallel vectors so as to develop a continuous surface, or skin, with improved strength and resolution. The time it takes to form each layer depends upon the geometry thereof, the surface tension and viscosity of material 86, and the thickness of that layer.

Alternatively, intermediate conductive elements 20 or other stereolithographically fabricated structures may each be formed as a partially cured outer skin extending above active surface 14 of semiconductor device 10 or above surface 34 of carrier substrate 30 and forming a dam within which unconsolidated material 86 can be contained. This may be particularly useful where intermediate conductive elements 20 or other structures protrude a relatively high distance above active surface 14. In this instance, support platform 90 may be submerged so that material 86 enters the area within the dam and raised above surface level 88, and then laser beam 98 activated and scanned to at least partially cure material 86 residing within the dam or, alternatively, to merely cure a "skin," a final cure of the material of intermediate conductive elements 20 or other structures under construction being effected subsequently by broad-source UV radiation in a chamber, or by thermal cure in an oven. In this manner, intermediate conductive elements 20 and other structures of extremely precise dimensions may be formed of material 86 by apparatus 80 in minimal time.

Once intermediate conductive elements 20 or other structures, or at least the outer skins thereof, have been fabricated, platform 90 is elevated above surface level 88 of material 86 and platform 90 is removed from apparatus 80, along with semiconductor device 10, carrier substrate 30, or another semiconductor device component upon which intermediate conductive elements 20 or other structures have been stereolithographically fabricated. Excess, unconsolidated material 86 (e.g., excess uncured liquid) may be manually removed from platform 90, from any substrate disposed thereon, and from intermediate conductive elements 20 or other stereolithographically fabricated structures. Each semiconductor device 10, carrier substrate 30, or other semiconductor device component is removed from platform 90, such as by cutting the semiconductor device component free of base supports 122. Alternatively, base supports 122 may be configured to readily release semiconductor devices 10, carrier substrates 30, or other semiconductor device components. As another alternative, a solvent may be employed to release base supports 122 from platform 90. Such release and solvent materials are known in the art. See, for example, U.S. Pat. No. 5,447,822 referenced above and previously incorporated herein by reference.

The stereolithographically fabricated intermediate conductive elements 20 or other structures, as well as semiconductor device 10, carrier substrate 30, or another semiconductor device component upon which these structures have been fabricated, may also be cleaned by use of known solvents that will not substantially degrade, deform, or damage the stereolithographically fabricated structures, such as intermediate conductive elements 20, or the semiconductor device components.

As noted previously, intermediate conductive elements 20 or other stereolithographically fabricated structures may then require postcuring. Intermediate conductive elements 20 or other structures may have regions of unconsolidated material contained within a boundary or skin thereof, or material 86 may be only partially consolidated (e.g., polymerized or cured) and exhibit only a portion (typically 40% to 60%) of its fully consolidated strength. Postcuring to completely harden intermediate conductive elements 20 or other stereolithographically fabricated structures may be effected in another apparatus projecting UV radiation in a continuous manner over the stereolithographically fabricated structures or by thermal completion of the initial, UV-initiated partial cure.

Fabrication of the Conductive Elements by Thermal Stereolithography

Referring again to FIGS. 12 and 13, when apparatus 180 is used to fabricate intermediate conductive elements 20, spray heads 192 direct liquified material 186 onto the appropriate location or locations of the one or more semiconductor devices 10, carrier substrates 30, or other semiconductor device components on platform 190, 90. The material is permitted to solidify to form the lowest layer 20A of each intermediate conductive element 20. Thermoplastic polymers that are useful as material 186 exhibit desirable electrical conductivity, exhibit low shrinkage upon solidification, substantially maintain their structural integrity under normal operating conditions (e.g., operating temperatures of the semiconductor device), are of sufficient (i.e., semiconductor grade) purity, exhibit good adherence to other semiconductor device materials, and have a coefficient of thermal expansion (CTE) similar to that of the materials adjacent thereto. Preferably, the CTE of material 186 is sufficiently similar to that of the adjacent materials to prevent undue stressing thereof during thermal cycling of semiconductor device 10, carrier substrate 30, or another semiconductor device component in testing, subsequent processing, and subsequent normal operation.

Platform 190 is then lowered a distance substantially equal to the next layer 20B of each intermediate conductive element 20 under construction. Heated conductive material 186 is then disposed by spray heads 192 onto appropriate locations of the previously fabricated layer 20A of each intermediate conductive element 20 to form layer 20B. This sequence continues, layer by layer, until each of the layers of intermediate conductive elements 20 have been completed.

In addition to being useful for fabricating intermediate conductive elements 20, apparatus 180 may also be used to fabricate nonconductive structures, such as dielectric layers and substrate layers, such as the nonconductive support layers of a circuit board or other carrier substrate.

Once intermediate conductive elements 20 or other structures have been fabricated, platform 190 is removed from apparatus 180, along with semiconductor device 10, carrier substrate 30, or another semiconductor device component upon which intermediate conductive elements 20 or other structures have been stereolithographically fabricated. Each semiconductor device 10, substrate 30, or other semiconductor device component is removed from platform 190, such as by cutting the semiconductor device component free of base supports 122. Alternatively, base supports 122 may be configured to readily release semiconductor devices 10, substrates 30, or other semiconductor device components. As another alternative, a solvent may be employed to release base supports 122 from platform 190. Such release and solvent materials are known in the art. See, for example, U.S. Pat. No. 5,447,822 referenced above and previously incorporated herein by reference.

The stereolithographically fabricated intermediate conductive elements 20 or other structures, as well as semiconductor device 10, carrier substrate 30, or another semiconductor device component upon which these structures have been fabricated, may also be cleaned by use of known solvents that will not substantially degrade, deform, or damage the stereolithographically fabricated structures, such as intermediate conductive elements 20, or the semiconductor device components.

The use of a stereolithographic process as exemplified above to fabricate intermediate conductive elements 20 is particularly advantageous since a large number of intermediate conductive elements 20 may be substantially simultaneously fabricated in a short time, the positioning thereof is computer controlled and extremely precise, wastage of material is minimal, and the stereolithography method requires minimal handling of semiconductor devices 10, carrier substrates 30, or other semiconductor device components.

Stereolithography is also an advantageous method of fabricating intermediate conductive elements 20 according to the present invention since stereolithography can be conducted at temperatures that will not damage or induce significant thermal stress on the semiconductor device components during fabrication of intermediate conductive elements 20 thereon. The stereolithography fabrication process may also be used to simultaneously form intermediate conductive elements 20 on several semiconductor device components or assemblies, saving fabrication time and expense. As the stereolithography method of the present invention recognizes specific semiconductor devices 10, carrier substrates 30, and other semiconductor device components, variations between different semiconductor device components are accommodated. Accordingly, when the stereolithography method of the present invention is employed, intermediate conductive elements 20 can be simultaneously fabricated on different types of semiconductor device components or assemblies of semiconductor device components.

Figure 1:
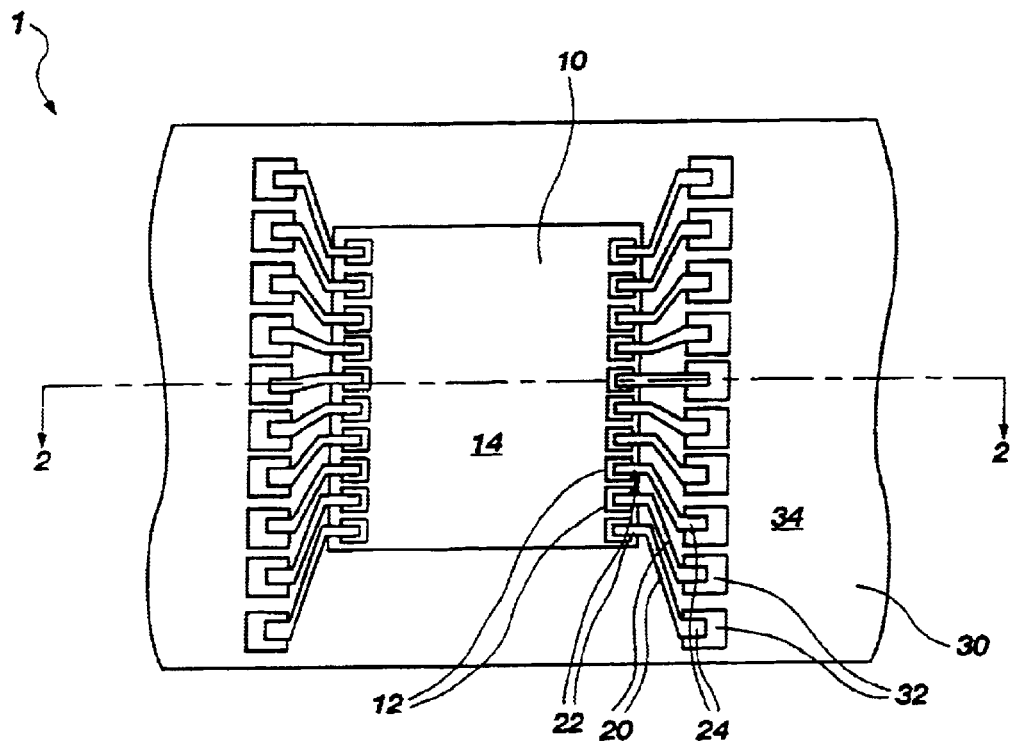
FIG. 1 is a top schematic representation of a first embodiment of an assembly according to the present invention, which includes a semiconductor die with bond pads electronically connected to the contact pads of a carrier substrate by way of the intermediate conductive elements of the present invention.
Figure 2:
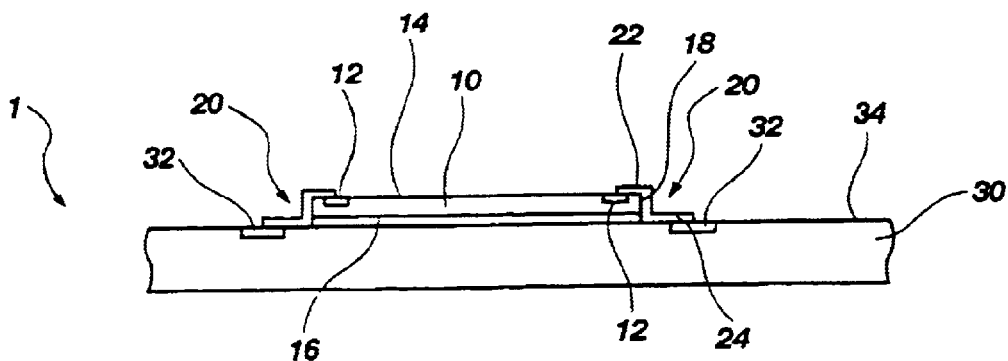
FIG. 2 is a cross-section taken along line 2—2 of FIG. 1.

Semiconductor Device Components and Assemblies Including the Conductive Elements Referring now to FIGS. 1 and 2, an assembly 1 of a semiconductor device 10 and a carrier substrate 30 is illustrated. Semiconductor device 10 is a semiconductor die that includes bond pads 12, which are also referred to herein as contact pads or contacts for simplicity, on an active surface 14 thereof. A back side 16 of semiconductor device 10 is disposed against a surface 34 of carrier substrate 30. Bond pads 12 of semiconductor device 10 are electrically connected to corresponding contact pads 32 of carrier substrate 30 by way of intermediate conductive elements 20. For simplicity, contact pads 32 are also referred to herein as contacts.

Intermediate conductive elements 20, which are fabricated by stereolithographic techniques, are formed from a conductive material, such as a conductive elastomer or a metal. Intermediate conductive elements 20 may each include a single layer or a plurality of superimposed, contiguous, mutually adhered layers of conductive material.

Each intermediate conductive element 20 is substantially entirely carried along the length thereof upon either semiconductor device 10 or carrier substrate 30. As illustrated in FIG. 2, each intermediate conductive element 20 extends across a portion of active surface 14 of semiconductor device 10, down a lateral edge 18 of semiconductor device 10, and across a portion of surface 34 of carrier substrate 30. A first end 22 of each intermediate conductive element 20 is in contact with a bond pad 12 and a second end 24 of intermediate conductive element 20 is connected to a contact pad 32 of carrier substrate 30.

Figure 3:
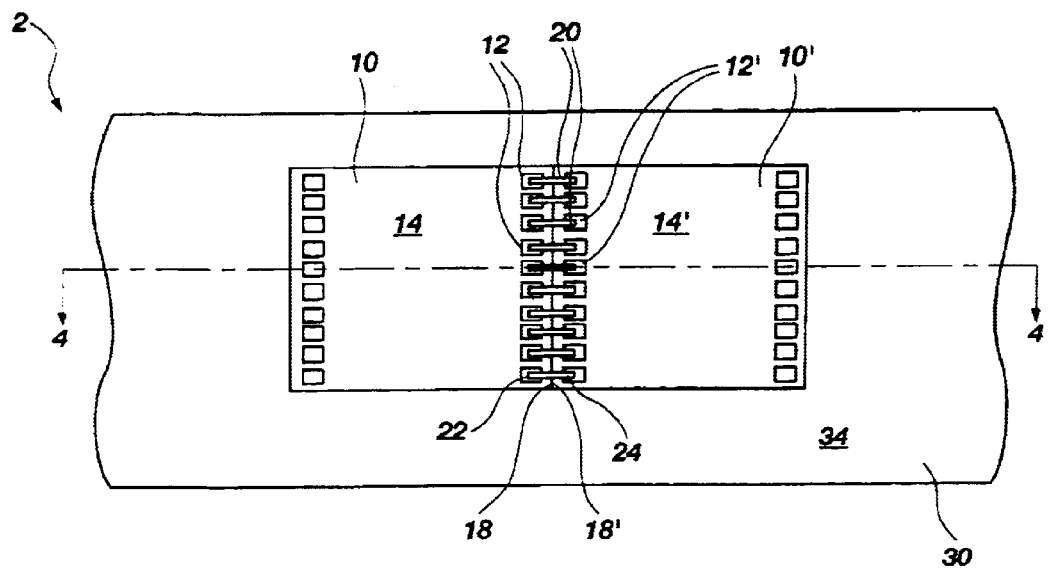
FIG. 3 is a top schematic representation of a second embodiment of an assembly according to the present invention, which includes two semiconductor dice with bond pads that are connected by way of the intermediate conductive elements of the present invention.
Figure 4:
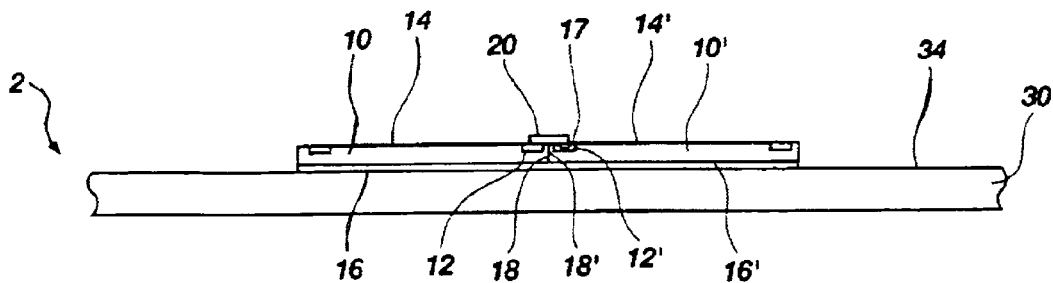
FIG. 4 is a cross-section taken along line 4—4 of FIG. 3.

FIGS. 3 and 4 illustrate another exemplary assembly 2 with intermediate conductive elements 20 of the present invention. Assembly 2 includes two semiconductor devices 10, 10' disposed on a carrier substrate 30. As illustrated, each semiconductor device 10, 10' is a semiconductor die that includes bond pads 12, 12', or contact pads or contacts, on an active surface 14, 14' thereof. Back sides 16, 16' of semiconductor devices 10, 10' are disposed over a surface 34 of carrier substrate 30, with a lateral edge 18 of one semiconductor device 10 abutting a lateral edge 18' of the other semiconductor device 10'. Corresponding bond pads 12, 12' of the two semiconductor devices 10, 10' are electrically connected to each other by way of intermediate conductive elements 20.

As in assembly 1 depicted in FIGS. 1 and 2, intermediate conductive elements 20 of assembly 2 are stereolithographically fabricated from an electrically conductive material, such as an electrically conductive thermoplastic polymer or a metal. Since intermediate conductive elements 20 are stereolithographically fabricated, each intermediate conductive element 20 may include one layer or a plurality of superimposed, contiguous, mutually adhered layers of conductive material.

With continued reference to FIGS. 3 and 4, substantially the entire lengths of intermediate conductive elements 20 are carried by semiconductor devices 10, 10'. As illustrated in FIG. 4, each intermediate conductive element 20 extends across a portion of active surface 14 of a first semiconductor device 10, over an interface 17 between abutting lateral edges 18, 18' of the two semiconductor devices 10, 10', and across a portion of active surface 14' of the second semiconductor device 10'. A first end 22 of each intermediate conductive element 20 is in contact with a bond pad 12 of one semiconductor device 10 and a second end 24 of intermediate conductive element 20 is connected to a bond pad 12' of the other semiconductor device 10' (FIG. 3).

Figure 5:
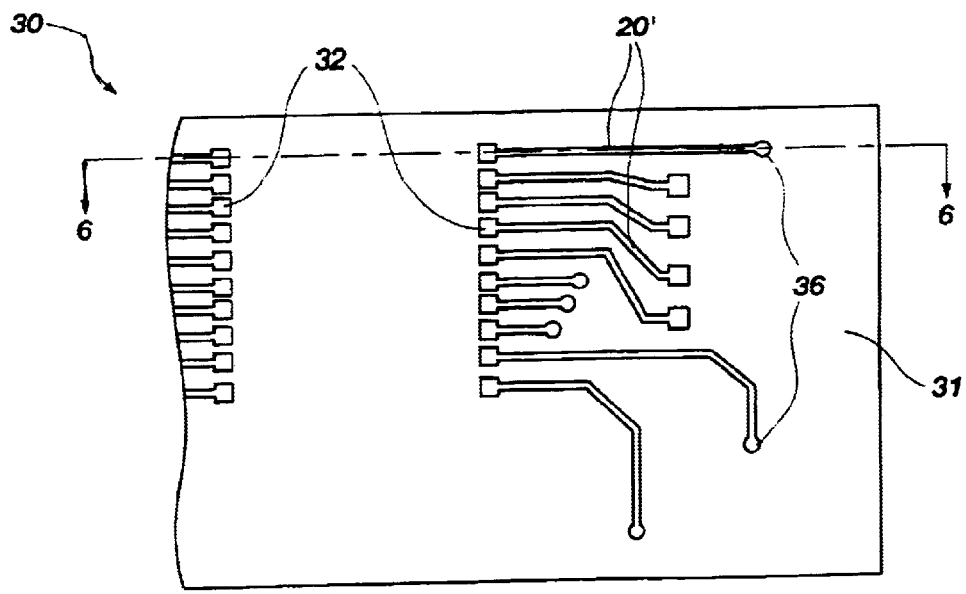
FIG. 5 is a top schematic representation of a circuit board with a single substrate layer, at least the intermediate conductive elements of the circuit board having been fabricated in accordance with the method of the present invention.
Figure 6:
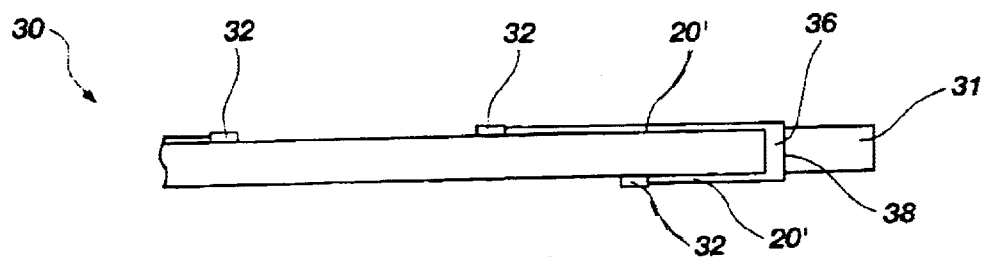
FIG. 6 is a cross-section taken along line 6—6 of FIG. 5.

Turning now to FIGS. 5 and 6, an embodiment of a carrier substrate 30, in this case a circuit board, is schematically depicted that includes stereolithographically fabricated intermediate conductive elements 20' according to the present invention. Carrier substrate 30 includes a single substrate layer 31, intermediate conductive elements 20' carried by carrier substrate 30, and a contact pad 32, or contact, at an end of each intermediate conductive element 20'. Intermediate conductive elements 20' that traverse more than one plane of carrier substrate 30 include vertically extending vias 36 along the lengths thereof. Vias 36 are located in through holes 38 formed through substrate layer 31.

As discussed previously herein, intermediate conductive elements 20' may be fabricated by stereolithographic techniques. Contact pads 32 may also be stereolithographically fabricated. Accordingly, each intermediate conductive element 20' and contact pad 32 may include one layer or a plurality of superimposed, contiguous, mutually adhered layers of conductive material. Exemplary conductive materials that may be used to form intermediate conductive elements 20' and contact pads 32 include known thermoplastic conductive polymers and metals. In order to fabricate intermediate conductive elements 20' on both sides of substrate layer 31, a first set of intermediate conductive elements 20' is fabricated on a first side of substrate layer 31. Substrate layer 31 is then inverted and a second set of intermediate conductive elements 20' is fabricated on a second side of substrate layer 31.

Figure 6A:
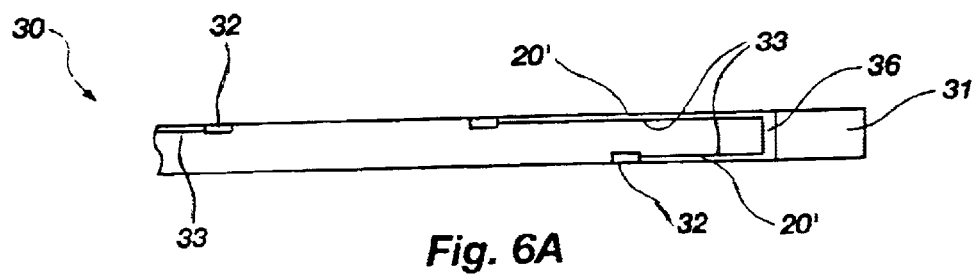
FIG. 6A is a cross-sectional representation of a variation of the circuit board shown in FIGS. 5 and 6, in which the conductive elements are at least partially recessed within the surrounding material.

Substrate layer 31 may similarly be fabricated from dielectric materials by stereolithographic processes such as those disclosed herein. As shown in FIG. 6A, when substrate layer 31 is stereolithographically fabricated, channels 33 may be recessed in one or both surfaces thereof to receive intermediate conductive elements 20'. Thus, the exposed surfaces of intermediate conductive elements 20' may be recessed relative to the surfaces of substrate layer 31 or substantially flush therewith. When stereolithography is used to fabricate substrate layer 31, the layer or layers of material are preferably deposited onto a flexible or fibrous matrix and become integral therewith, thereby imparting strength and some flexibility to the fabricated substrate layer 31.

When both intermediate conductive elements 20' and substrate layer 31 are stereolithographically fabricated, carrier substrates 30 that carry intermediate conductive elements 20' on both surfaces thereof may be fabricated by forming a first, bottom set of intermediate conductive elements 20' on a platform of a suitable stereolithography apparatus, forming substrate layer 31 over the first set of intermediate conductive elements 20', then forming a second, upper set of intermediate conductive elements 20' on substrate layer 31. Any vias 36 that extend vertically through substrate layer 31 may be fabricated before, during, or after the fabrication of substrate layer 31. When both intermediate conductive elements 20' and substrate layer 31 are fabricated by use of stereolithography, the same stereolithographic technique and apparatus are preferably employed to fabricate intermediate conductive elements 20' and substrate layer 31. Accordingly, carrier substrate 30 need not be moved between different stereolithographic apparatus during fabrication thereof. However, the use of different stereolithographic techniques and apparatus to fabricate intermediate conductive elements 20' and substrate layer 31 are also within the scope of the present invention.

Figure 7:
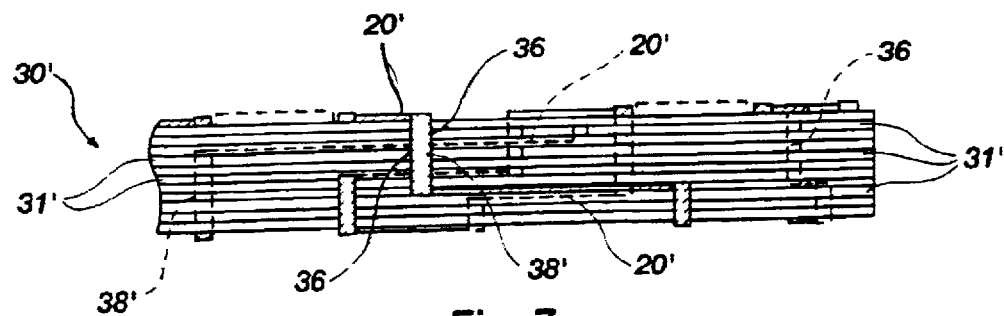
FIG. 7 is a schematic cross-sectional representation of a multilayered circuit board with stereolithographically fabricated intermediate conductive elements.

FIG. 7 schematically illustrates a multilayer carrier substrate 30' according to the present invention, which includes a plurality of superimposed, contiguous, mutually adhered layers 31' of dielectric material and intermediate conductive elements 20' that are each carried by one or more of layers 31'. Intermediate conductive elements 20' that are carried by more than one layer 31' and, thus, that extend along more than one plane through carrier substrate 30' include vias 36 along the lengths thereof. Vias 36 extend substantially vertically through holes 38' formed in one or more layers 31'.

Intermediate conductive elements 20', which are preferably fabricated by stereolithographic techniques such as those disclosed herein, each include one layer or a plurality of superimposed, contiguous, mutually adhered layers of conductive material, such as a conductive elastomer (e.g., a thermoplastic conductive elastomer or a conductive photopolymer) or a metal.

One or more layers 31' of carrier substrate 30' may also be fabricated by stereolithographic techniques using a dielectric material. When stereolithography is used to fabricate layers 31' of carrier substrate 30', each layer 31' may be made by disposing dielectric material onto a layer of a flexible or fibrous matrix to impart strength and some flexibility to each fabricated substrate layer 31'.

When both intermediate conductive elements 20' and substrate layer 31' are stereolithographically fabricated, a first, bottom set of intermediate conductive elements 20' may be formed on a platform of a suitable stereolithography apparatus, forming a first substrate layer 31' over or laterally adjacent to the first set of intermediate conductive elements 20'. The appropriate sequence of forming intermediate conductive elements 20' and substrate layers 31' then continues until a multilayer carrier substrate 30' of desired configuration has been fabricated. Any vias 36 that extend vertically through one or more substrate layers 31' may be fabricated before, during, or after the fabrication of the substrate layers 31'. When both intermediate conductive elements 20' and substrate layers 31' are fabricated by use of stereolithography, the same stereolithographic technique and apparatus are preferably employed to fabricate intermediate conductive elements 20' and substrate layers 31'. Accordingly, carrier substrate 30' need not be moved between different stereolithographic apparatus during fabrication thereof. However, the use of different stereolithographic techniques and apparatus to fabricate intermediate conductive elements 20' and substrate layers 31' are also within the scope of the present invention.

Figure 8:
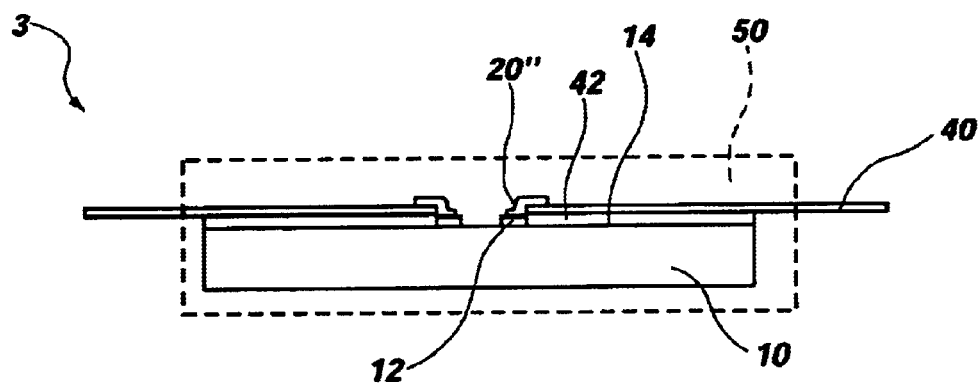
FIG. 8 is a schematic representation of an assembly including a packaged semiconductor device with leads that are electrically connected to corresponding contact pads of a carrier substrate by way of the intermediate conductive elements of the present invention.
Figure 9:
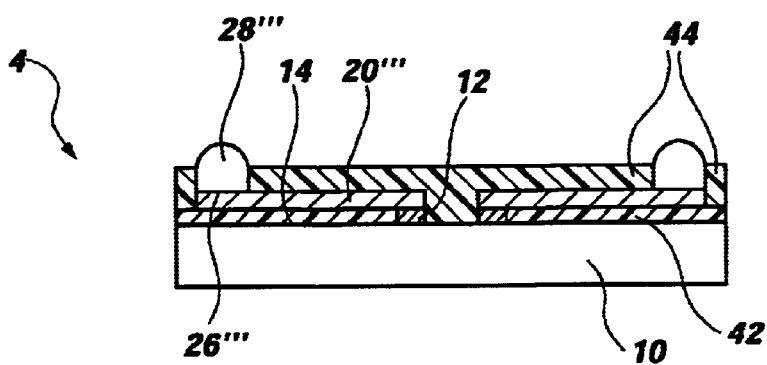
FIG. 9 is a schematic representation of an assembly including a semiconductor die and leads connected to the bond pads thereof by way of the intermediate conductive elements of the present invention.

Turning now to FIGS. 8 and 9, packaged semiconductor devices that include stereolithographically fabricated conductive elements are also within the scope of the present invention.

FIG. 8 illustrates an exemplary semiconductor device package 3 incorporating teachings of the present invention. Semiconductor device package 3 includes a semiconductor device 10, illustrated as a leads-over-chip (LOC) type semiconductor die, leads 40 positioned over an active surface 14 of semiconductor device 10 proximate corresponding bond pads 12 on active surface 14, and intermediate conductive elements 20" disposed between leads 40 and bond pads 12 so as to establish electrical communication therebetween. Leads 40 and active surface 14 are electrically isolated from one another by way of one or more dielectric layers 42 disposed therebetween. Semiconductor device package 3 may also include a package 50. While package 50 is illustrated as covering substantially the entire semiconductor device 10 and the portions of leads 40 adjacent semiconductor device 10, package 50 may only enclose bond pads 12 and intermediate conductive elements 20".

Intermediate conductive elements 20" are stereolithographically fabricated structures that may include one layer or a plurality of superimposed, contiguous, mutually adhered layers of a conductive material, such as a conductive elastomer or a metal. Dielectric layers 42 and package 50 may also be fabricated by stereolithographic techniques.

With reference to FIG. 9, another embodiment of a semiconductor device package 4 that incorporates teachings of the present invention is illustrated. Semiconductor device package 4 includes a semiconductor device 10, illustrated as a LOC type semiconductor die, with bond pads 12 on an active surface 14 thereof. Intermediate conductive elements 20'" communicate with selected bond pads 12 and extend laterally so as to reroute selected bond pads 12 to different lateral locations relative to active surface 14. The laterally extending portions of intermediate conductive elements 20'" are electrically isolated from active surface 14 by way of a dielectric layer 42 positioned therebetween. Each intermediate conductive element 20'" includes a contact 26'" at an end or along the length thereof. Contacts 26'" are at least electrically exposed through a protective layer 44 and may include integral conductive structures 28'" or attached conductive structures 28'", such as solder bumps, protruding therefrom.

Intermediate conductive elements 20'" are stereolithographically fabricated and may each include a single layer or a plurality of superimposed, contiguous, mutually adhered layers of a conductive material, such as a conductive elastomer or a metal. Conductive structures 28'" protruding from intermediate conductive elements 20'" may also be stereolithographically fabricated from conductive material. In addition, dielectric layer 42 and protective layer 44 may be fabricated from dielectric materials by use of stereolithographic techniques.

Figure 10:
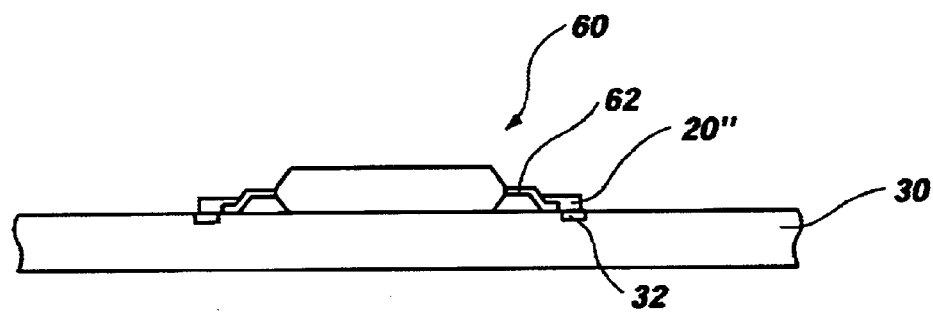
FIG. 10 is a schematic cross-sectional representation of a semiconductor device including a semiconductor die, intermediate conductive elements of the present invention in communication with the bond pads of the semiconductor die to reroute same, and a dielectric layer disposed between the intermediate conductive elements and the active surface of the semiconductor die.

FIG. 10 illustrates yet another use of conductive elements according to the present invention, wherein a packaged semiconductor device 60 with leads 62 extending therefrom is connected to a carrier substrate 30. Leads 62 are electrically connected to corresponding contact pads 32 of carrier substrate 30 by way of intermediate conductive elements 20", such as those described above with reference to FIG. 8.

Of course, other semiconductor devices and semiconductor device assemblies that includes stereolithographically fabricated conductive elements are also within the scope of the present invention.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method for fabricating at least one conductive element, comprising:
    placing a surface of at least one semiconductor device component in a horizontal plane; and
    directing a consolidating beam over at least one selected region of said surface to at least partially consolidate previously unconsolidated conductive material over said at least one selected region.

2. The method of claim 1, further comprising recognizing a location and orientation of said surface of said at least one semiconductor device component over which said directing is to be effected.

3. The method of claim 2, further comprising storing data including at least one physical parameter of said at least one semiconductor device component and of said at least one conductive element in computer memory, and using said stored data in conjunction with a machine vision system to recognize said location and orientation of said at least one semiconductor device component.

4. The method of claim 3, further comprising using said stored data, in conjunction with said machine vision system, to effect said directing.

5. The method of claim 1, further including securing said at least one semiconductor device component to a carrier prior to placing said surface of said at least one semiconductor device component in said horizontal plane.

6. The method of claim 1, wherein said placing comprises placing a surface of at least one of a carrier substrate, leads, a semiconductor die, and a packaged semiconductor die in said horizontal plane.

7. The method of claim 1, wherein said directing includes:
    defining a first layer of said at least one conductive element from substantially unconsolidated conductive material; and
    defining at least one additional layer of said at least one conductive element from substantially unconsolidated conductive material at least partially superimposed over a previously defined layer of said at least one conductive element.

8. The method of claim 1, wherein said directing comprises directing said consolidating beam toward a liquefiable thermoplastic conductive elastomer.

9. The method of claim 1, wherein said directing comprises directing said consolidating beam toward a conductive photocurable polymer.

10. The method of claim 1, wherein said directing comprises directing said consolidating beam toward a particulate or powdered metal.

11. The method of claim 1, wherein said directing comprises directing an energy beam.

12. The method of claim 11, wherein said directing said energy beam comprises directing a laser beam.

13. A method for fabricating at least one conductive element, comprising:
placing a surface of at least one semiconductor device component in a horizontal plane;
recognizing a location and orientation of said surface; and
selectively consolidating selected regions of at least one layer of substantially unconsolidated conductive material located over said surface of said at least one semiconductor device component.

14. The method of claim 13, further comprising storing data including at least one physical parameter of said at least one semiconductor device component and of said at least one conductive element in computer memory, and using said stored data in conjunction with a machine vision system to recognize said location and orientation of said surface of said at least one semiconductor device component.

15. The method of claim 14, wherein said recognizing comprises using said stored data, in conjunction with said machine vision system, to recognize a location on said surface of said at least one semiconductor device component upon which said at least one conductive element is to be fabricated.

16. The method of claim 13, wherein said placing at least one semiconductor device component comprises placing at least one of a carrier substrate, leads, a semiconductor die, and a packaged semiconductor die.

17. The method of claim 13, wherein said selectively consolidating includes:
defining a first layer of said at least one conductive element from said substantially unconsolidated conductive material.

18. The method of claim 13, wherein said selectively consolidating is effected with at least one of a liquefiable thermoplastic conductive elastomer, a conductive photocurable polymer, and a particulate or powdered metal.

19. The method of claim 13, wherein said selectively consolidating comprises directing an energy beam over said selected regions.

20. The method of claim 17, wherein said selectively consolidating further includes:
defining at least one additional layer of said at least one conductive element from substantially unconsolidated conductive material at least partially superimposed over a previously defined layer of said at least one conductive element.

21. A method for fabricating at least one conductive element, comprising:
placing a surface of at least one semiconductor device component in a horizontal plane;
directing a consolidating beam over at least one selected region of said surface to at least partially consolidate previously unconsolidated conductive material over said at least one selected region;
recognizing a location and orientation of said surface of said at least one semiconductor device component over which said directing is to be effected;
storing data including at least one physical parameter of said at least one semiconductor device component and of said at least one conductive element in computer memory; and
using said stored data in conjunction with a machine vision system to recognize said location and orientation of said at least one semiconductor device component.

22. The method of claim 21, further comprising using said stored data, in conjunction with said machine vision system, to effect said directing.

23. The method of claim 21, further including securing said at least one semiconductor device component to a carrier prior to placing said surface of said at least one semiconductor device component in said horizontal plane.

24. The method of claim 21, wherein said placing comprises placing a surface of at least one of a carrier substrate, leads, a semiconductor die, and a packaged semiconductor die in said horizontal plane.

25. The method of claim 21, wherein said directing includes:
defining a first layer of said at least one conductive element from substantially unconsolidated conductive material; and
defining at least one additional layer of said at least one conductive element from substantially unconsolidated conductive material at least partially superimposed over a previously defined layer of said at least one conductive element.

26. The method of claim 21, wherein said directing comprises directing said consolidating beam toward a liquefiable thermoplastic conductive elastomer.

27. The method of claim 21, wherein said directing comprises directing said consolidating beam toward a conductive photocurable polymer.

28. The method of claim 21, wherein said directing comprises directing said consolidating beam toward a particulate or powdered metal.

29. The method of claim 21, wherein said directing comprises directing an energy beam.

30. The method of claim 29, wherein said directing said energy beam comprises directing a laser beam.

31. A method for fabricating at least one conductive element, comprising:
placing a surface of at least one semiconductor device component in a horizontal plane;
recognizing a location and orientation of said surface;
stereolithographically fabricating at least one conductive element comprising at least one layer of at least partially consolidated material on said at least one semiconductor device component;
storing data including at least one physical parameter of said at least one semiconductor device component and of said at least one conductive element in computer memory; and
using said stored data in conjunction with a machine vision system to recognize said location and orientation of said surface of said at least one semiconductor device component.

32. The method of claim 31, wherein said recognizing comprises using said stored data, in conjunction with said machine vision system, to recognize a location on said surface of said at least one semiconductor device component upon which said at least one conductive element is to be fabricated.

33. The method of claim 31, wherein said placing at least one semiconductor device component comprises placing at least one of a carrier substrate, leads, a semiconductor die, and a packaged semiconductor die.

34. The method of claim 31, wherein said stereolithographically fabricating is includes defining a first layer of said at least one conductive element from said substantially unconsolidated conductive material.

35. The method of claim 31, wherein said stereolithographically fabricating is effected with at least one of a liquefiable thermoplastic conductive elastomer, a conductive photocurable polymer, and a particulate or powdered metal.

36. The method of claim 31, wherein said stereolithographically fabricating comprises selectively consolidating selected regions of at least one layer of unconsolidated conductive material located over said surface of said at least one semiconductor device component.

37. The method of claim 36, wherein said selectively consolidating comprises directing an energy beam over said selected regions.

38. The method of claim 34, wherein said stereolithographically fabricating further includes defining at least one additional layer of said at least one conductive element from substantially unconsolidated conductive material at least partially superimposed over a previously defined layer of said at least one conductive element.

* * * * *